US007972143B2

(12) United States Patent
Smejtek

(10) Patent No.: US 7,972,143 B2
(45) Date of Patent: Jul. 5, 2011

(54) PRINTED CIRCUIT ASSEMBLY

(75) Inventor: Dalibor Smejtek, Portland, OR (US)

(73) Assignee: Tyco Electronics Corporation, Berwyn, PA (US)

( * ) Notice: Subject to any disclaimer, the term of this patent is extended or adjusted under 35 U.S.C. 154(b) by 70 days.

(21) Appl. No.: 12/364,333

(22) Filed: Feb. 2, 2009

(65) Prior Publication Data
US 2010/0197150 A1 Aug. 5, 2010

(51) Int. Cl.
*H01R 12/00* (2006.01)
(52) U.S. Cl. .......................................................... 439/61
(58) Field of Classification Search .................... 439/61, 439/188, 637, 489, 260; 361/788
See application file for complete search history.

(56) References Cited

U.S. PATENT DOCUMENTS

| | | | |
|---|---|---|---|
| 4,017,135 A | 4/1977 | Taguchi | |
| 4,494,818 A | 1/1985 | Petersen et al. | |
| 4,815,979 A | 3/1989 | Porter | |
| 5,217,383 A | 6/1993 | Hildebrandt et al. | |
| 5,317,477 A | 5/1994 | Gillett | |
| 5,365,403 A | 11/1994 | Vinciarelli et al. | |
| 5,511,984 A | 4/1996 | Olson et al. | |
| 5,661,901 A | 9/1997 | King | |
| 5,697,800 A | 12/1997 | Aramizu | |
| 5,754,411 A | 5/1998 | Woychik | |
| 5,924,876 A | 7/1999 | Beamenderfer et al. | |
| 6,171,139 B1 | 1/2001 | Sato et al. | |
| 6,206,713 B1 | 3/2001 | Baertsoen et al. | |
| 6,244,881 B1 * | 6/2001 | Hara ............................. 439/188 |
| 6,280,201 B1 | 8/2001 | Morris | |
| 6,320,759 B1 | 11/2001 | Tusan et al. | |
| 6,345,990 B1 | 2/2002 | Hyzin | |
| 6,435,892 B1 | 8/2002 | Billman | |
| 6,460,170 B1 | 10/2002 | Shaeffer et al. | |
| 6,736,647 B1 | 5/2004 | Gillenberg | |
| 6,837,741 B2 | 1/2005 | Kuwahara | |
| 6,932,617 B2 * | 8/2005 | Debord et al. ................... 439/65 |
| 7,252,537 B2 * | 8/2007 | Simon et al. .................. 439/489 |
| 7,364,461 B1 | 4/2008 | Back et al. | |
| 2002/0004323 A1 | 1/2002 | Azuma | |
| 2003/0014728 A1 | 1/2003 | Shaeffer et al. | |
| 2003/0117129 A1 | 6/2003 | Parrish | |
| 2006/0128174 A1 | 6/2006 | Jang et al. | |

FOREIGN PATENT DOCUMENTS

| | | |
|---|---|---|
| CH | 578 300 | 7/1976 |
| DD | 137 305 | 8/1979 |
| EP | 0 786 856 A1 | 7/1997 |
| GB | 1256332 A | 12/1971 |

(Continued)

OTHER PUBLICATIONS

International Search Report for International Application No. PCT/US2010/000277.

*Primary Examiner* — Jean F Duverne

(57) ABSTRACT

A printed circuit assembly includes a base printed circuit having a printed circuit receiving area and a plurality of electrical contacts provided on the printed circuit receiving area. The printed circuit assembly also includes a secondary printed circuit having a secondary substrate including a mating edge and a plurality of secondary contacts provided along the mating edge. The secondary printed circuit is mounted on the base printed circuit such that the mating edge of the secondary printed circuit is directly engaged with the base printed circuit at the printed circuit receiving area. Each of the secondary contacts is electrically connected to a corresponding one of the electrical contacts of the base printed circuit.

14 Claims, 11 Drawing Sheets

FOREIGN PATENT DOCUMENTS

| | | |
|---|---|---|
| JP | 7057832 A | 3/1995 |
| JP | 9298360 A | 11/1997 |
| WO | WO 96/08415 | 3/1996 |
| WO | WO 98/35821 | 8/1998 |
| WO | WO 99/44260 | 9/1999 |

* cited by examiner

PRINTED CIRCUIT ASSEMBLY

BACKGROUND OF THE INVENTION

The subject matter described and/or illustrated herein relates generally to printed circuits, and, more particularly, to electrically connecting printed circuits together.

Some electrical systems include a relatively high number of ground and/or signal paths between electrical components of the system. For example, hundreds or thousands of ground and/or signal paths may be routed between electrical components of the system. Because of the ever increasing demand on individual electrical components, and the system overall, to accommodate more signal and/or ground paths, it may be desirable to increase the density of electrical contacts at interconnection points between the electrical components of the system. For example, it may be desirable to increase the density of electrical contacts where two or more printed circuits are electrically interconnected. Moreover, increased density may be desirable at locations within the system where a relatively high number of signal and/or ground paths are routed to a relatively compact component, such as a cable that may include a bundle of a plurality of smaller electrical leads and/or coaxial cables. For example, a smaller printed circuit that terminates a plurality of coaxial cables may have a relatively high density of electrical contacts for receiving a relatively high number of signal and/or ground paths from a larger printed circuit of the system.

Typically, printed circuits are electrically connected together using one or more intervening electrical connector assemblies. Specifically, one of the printed circuits may include an electrical connector assembly that mates with electrical contacts on the secondary printed circuit. Alternatively, both printed circuits include electrical connector assemblies that mate with each other. Each electrical connector assembly typically includes a housing that holds a plurality of mating contacts. Each mating contact is electrically connected to one or more corresponding electrical contacts of the printed circuit on which the electrical connector assembly is mounted. To establish an electrical connection between the printed circuits, the mating contacts of the electrical connector assemblies directly engage either the electrical contacts on the secondary printed circuit or the mating contacts of the electrical connector assembly of the secondary printed circuit. As described above, it may be desirable to increase the density of the electrical contacts of the printed circuits where they interconnect. For example, it may be desirable to increase the density of electrical contacts on a printed circuit that terminates the end of a cable to accommodate interconnecting more electrical leads and/or coaxial cables to the other printed circuit. However, increasing the density of the electrical contacts of the printed circuit may require increasing the density of the mating contacts of the electrical connector assembl(ies). Increasing the density of the mating contacts of the electrical connector assembl(ies) may decrease the signal integrity of the electrical connection between the printed circuits.

There is a need for increasing the density of electrical contacts at the interconnection between printed circuits without decreasing signal integrity. For example, there is a need for connecting a printed circuit that terminates an increased number of electrical leads and/or coaxial cables to another printed circuit without decreasing signal integrity.

BRIEF DESCRIPTION OF THE INVENTION

In one embodiment, a printed circuit assembly includes a base printed circuit having a printed circuit receiving area and a plurality of electrical contacts provided on the printed circuit receiving area. The printed circuit assembly also includes a secondary printed circuit having a secondary substrate including a mating edge and a plurality of secondary contacts provided along the mating edge. The secondary printed circuit is mounted on the base printed circuit such that the mating edge of the secondary printed circuit is directly engaged with the base printed circuit at the printed circuit receiving area. Each of the secondary contacts is electrically connected to a corresponding one of the electrical contacts of the base printed circuit.

Optionally, the secondary printed circuit includes a cable-receiving edge configured to receive a plurality of coaxial cables, and the secondary substrate of the secondary printed circuit has a plurality of secondary traces that are each electrically connected to a corresponding one of the secondary contacts, wherein each of the plurality of coaxial cables is terminated to a corresponding one of the secondary traces. The printed circuit receiving area of the base printed circuit optionally includes a slot and the mating edge of the secondary printed circuit is optionally received within the slot. At least one electrical contact of the base printed circuit is optionally electrically connected to the corresponding secondary contact of the secondary printed circuit via an electrical bonding material. At least one electrical contact of the base printed circuit is optionally directly engaged with the corresponding secondary contact of the secondary printed circuit. At least one electrical contact of the base printed circuit optionally extends on an exterior surface of the base printed circuit. Moreover, at least one secondary contact of the secondary printed circuit optionally extends on an exterior surface of the secondary printed circuit. Optionally, the secondary printed circuit extends at an approximately non-parallel angle relative to the base printed circuit. In some embodiments, the secondary printed circuit extends approximately perpendicular relative to the base printed circuit. Optionally, at least one electrical contact of the base printed circuit includes an electrically conductive pad. Optionally, at least one secondary contact of the secondary printed circuit includes an electrically conductive pad.

In another embodiment, a printed circuit assembly includes a base printed circuit having a printed circuit receiving area and a plurality of electrical contacts provided on the printed circuit receiving area. The printed circuit assembly also includes a plurality of secondary printed circuits. Each of the secondary printed circuits has a secondary substrate including a mating edge and a plurality of secondary contacts provided along the mating edge. Each of the secondary printed circuits is mounted on the base printed circuit such that the secondary substrate of each secondary printed circuit is directly engaged with the base printed circuit at the printed circuit receiving area of the base printed circuit. Each of the secondary contacts is electrically connected to a corresponding one of the electrical contacts of the base printed circuit.

Optionally, each secondary printed circuit includes a cable-receiving edge configured to receive a plurality of coaxial cables, and the secondary substrate of each secondary printed circuit has a plurality of secondary traces that are each electrically connected to a corresponding one of the secondary contacts, wherein each of the plurality of coaxial cables is terminated to a corresponding one of the secondary traces. Optionally, the printed circuit receiving area of the base printed circuit includes a plurality of slots and the mating edge of each of the secondary printed circuits is received within a corresponding one of the slots. At least one of the plurality of electrical contacts of the base printed circuit is optionally electrically connected to the corresponding secondary contact of the corresponding secondary printed circuit via an electrical bonding material. At least one of the plurality of electrical contacts of the base printed circuit is optionally directly engaged with the corresponding secondary contact of the corresponding secondary printed circuit. At least one of the plurality of electrical contacts of the base printed circuit optionally extends on an exterior surface of the base printed circuit. At least one secondary contact of at least one of the secondary printed circuits optionally extends on an exterior surface of the corresponding secondary printed circuit. Optionally, at least one of the secondary printed circuits extends at an approximately non-parallel angle relative to the base printed circuit. Optionally, at least one of the secondary printed circuits extends approximately perpendicular relative to the base printed circuit. The secondary printed circuits optionally include two printed circuits that extend approximately parallel relative to each other. Optionally, the secondary printed circuits include two printed circuits that include different thicknesses and/or extend different heights.

In another embodiment, a printed circuit assembly includes a base printed circuit having a printed circuit receiving area and a plurality of electrical contacts provided on the printed circuit receiving area. The printed circuit assembly also includes a secondary printed circuit having a secondary substrate including a plurality of secondary contacts. The secondary printed circuit is mounted on the base printed circuit at the printed circuit receiving area of the base printed circuit. Each of the secondary contacts of the secondary printed circuit is electrically connected to a corresponding one of the electrical contacts of the base printed circuit via an electrical bonding material.

DETAILED DESCRIPTION OF THE INVENTION

Figure 1:
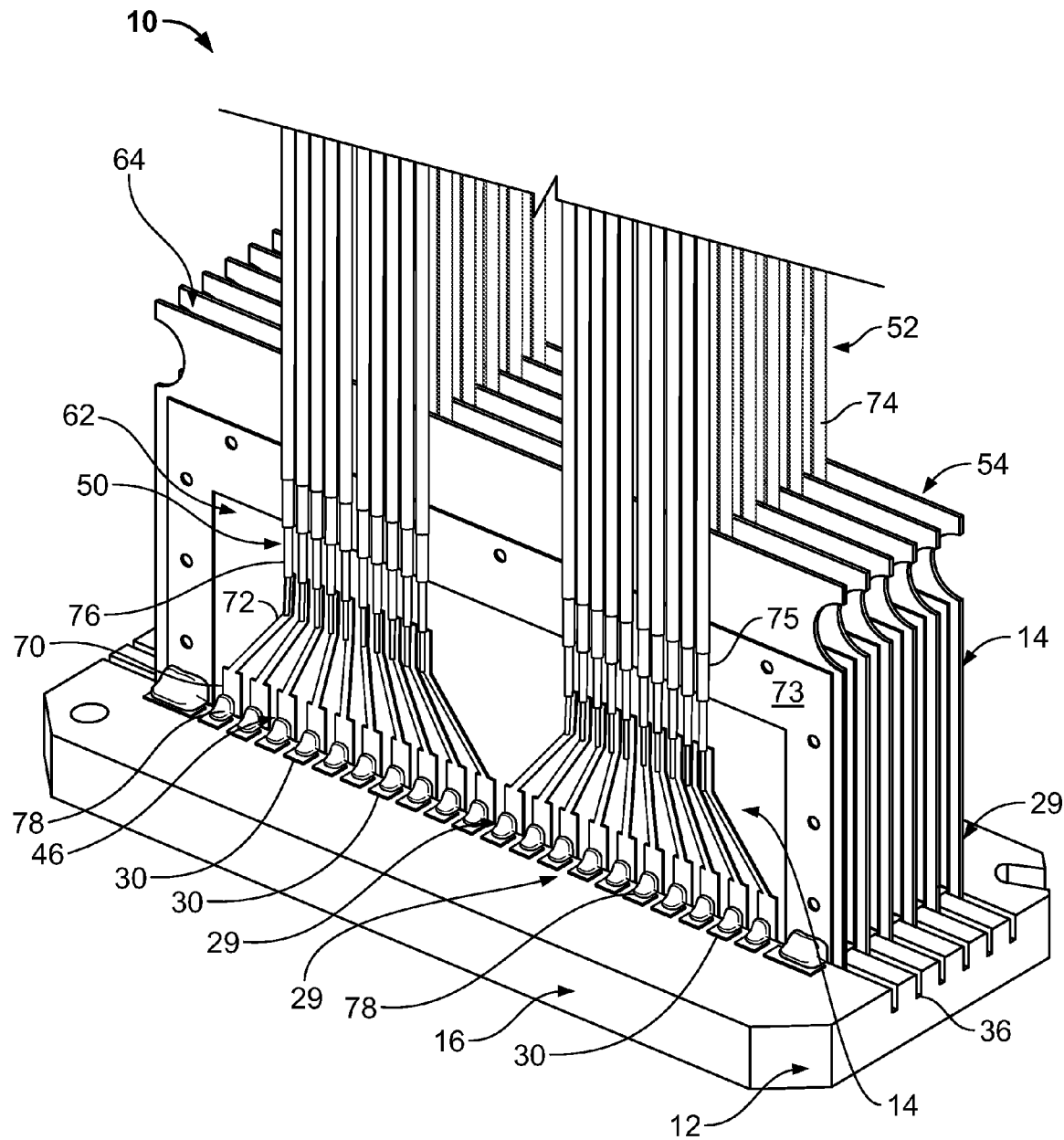
FIG. 1 is a perspective view of an exemplary embodiment of a printed circuit assembly.

FIG. 1 is a perspective view of an exemplary embodiment of a printed circuit assembly 10. The printed circuit assembly 10 includes a base printed circuit 12 and a plurality of secondary printed circuits 14. Each of the secondary printed circuits 14 is mounted on the base printed circuit 12 such that the secondary printed circuit 14 is electrically connected to the base printed circuit 12. Electrical connection between the base printed circuit 12 and each of the secondary printed circuits 14 enables the transmission of electrical signals, electrical ground, and/or electrical power between electrical devices (not shown). Each of the electrical devices may be electrically connected to the base printed circuit 12 or one or more of the secondary printed circuits 14, or the base printed circuit 12 or one or more of the secondary printed circuits 14 may be a component of one or more of the electrical devices. As will be described below, each of the secondary printed circuits 14 is mounted on, including being electrically connected to, the base printed circuit 12 without the use of an intervening electrical connector assembly (not shown).

As used herein, the term "printed circuit" is intended to mean any electric circuit in which the conducting connections have been printed or otherwise deposited in predetermined patterns on an insulating base. Although the base printed circuit 12 is shown herein as having six secondary printed circuits 14 mounted thereon in electrical connection therewith, any number of secondary printed circuits 14 may be mounted on the base printed circuit 12 in electrical connection therewith. Each of the electrical devices may be any type of electrical component. The base printed circuit 12 may be referred to herein as a "receiving printed circuit".

Figure 2:
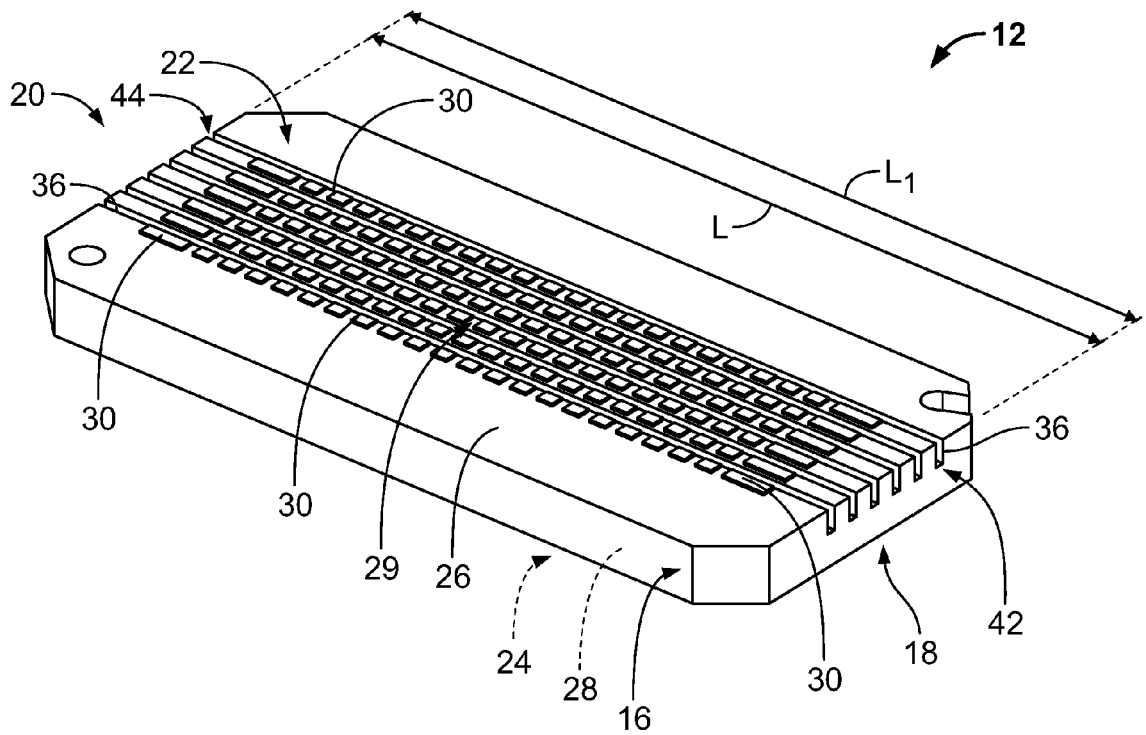
FIG. 2 is a perspective view of an exemplary embodiment of a base printed circuit of the printed circuit assembly shown in FIG. 1.
Figure 4:
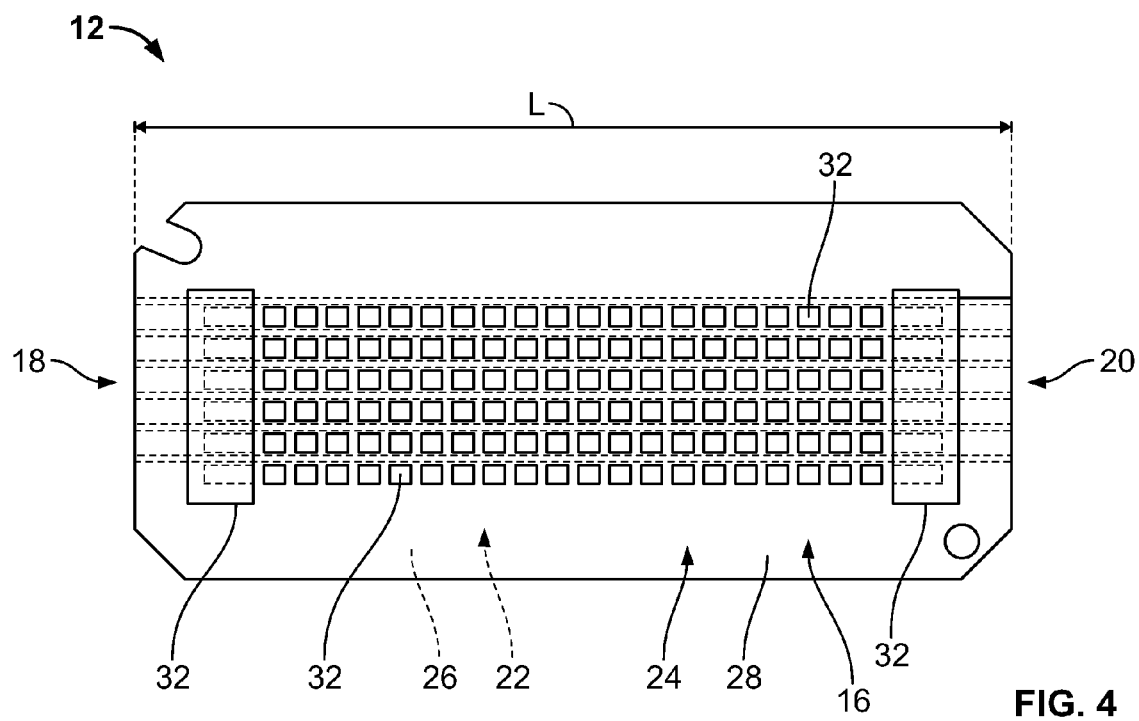
FIG. 4 is a bottom plan view of the base printed circuit shown in FIGS. 2 and 3.
Figure 5:
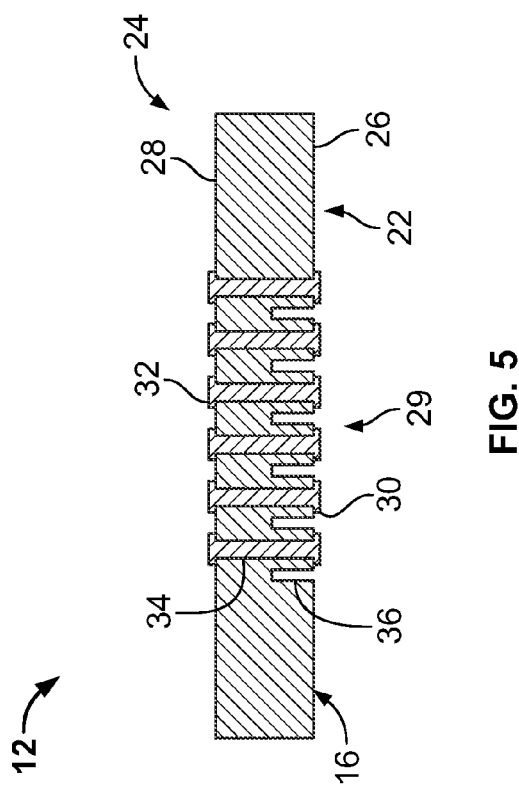
FIG. 5 is a cross-sectional view of base printed circuit shown in FIGS. 2-4 taken along line 5-5 of FIG. 3.
Figure 3:
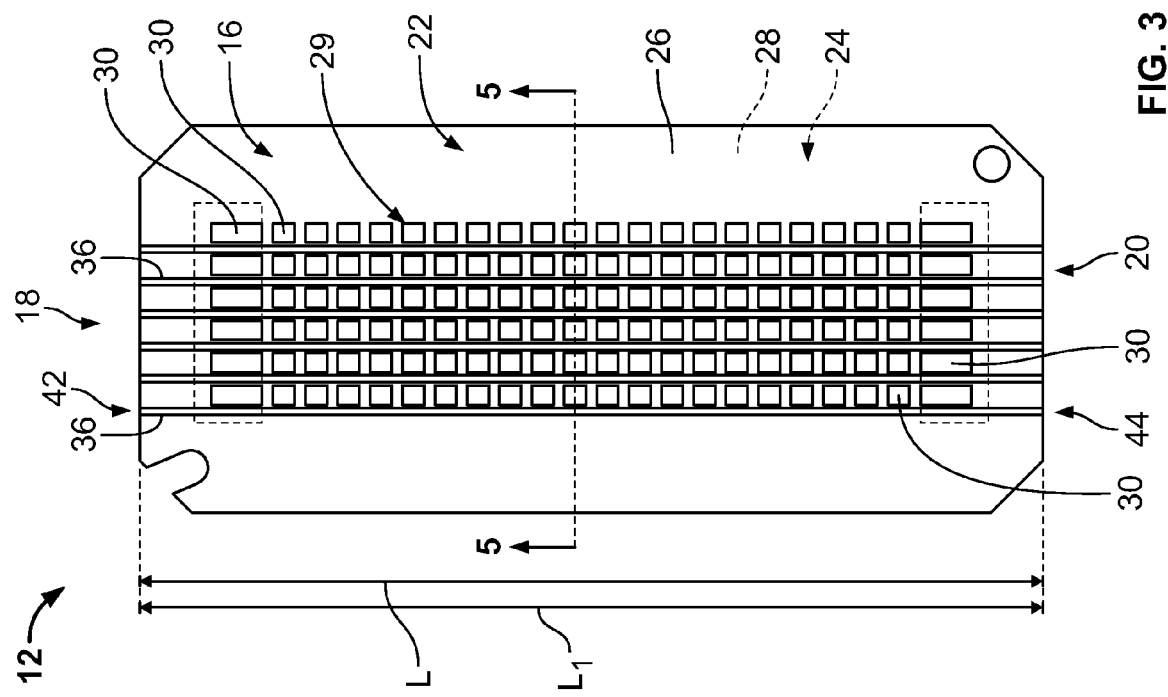
FIG. 3 is a top plan view of the base printed circuit shown in FIG. 2.

FIG. 2 is a perspective view of an exemplary embodiment of the base printed circuit 12. FIG. 3 is a top plan view of the base printed circuit 12. FIG. 4 is a bottom plan view of the base printed circuit 12. FIG. 5 is a cross-sectional view of base printed circuit 12 taken along line 5-5 of FIG. 3. The base printed circuit 12 includes a substrate 16 extending a length L from an end portion 18 to an opposite end portion 20. The substrate 16 includes a pair of opposite sides 22 and 24. Each side 22 and 24 includes a respective exterior surface 26 and 28. The side 22 includes a printed circuit receiving area 29 that, as will be described below, receives the secondary printed circuits 14 (FIGS. 1, 7, 8, and 9). In the exemplary embodiment, each of the exterior surfaces 26 and 28, and thus each side 22 and 24, includes a plurality of electrical contacts 30 and 32, respectively, extending thereon. At least some of the electrical contacts 30 are provided on the printed circuit receiving area 29 of the side 22. Alternatively, only one of the exterior surfaces 26 and 28, and thus only one of the sides 22 and 24, includes the respective electrical contacts 30 and 32 thereon. In the exemplary embodiment, the electrical contacts 30 on the side 22 are electrically connected to the electrical contacts 32 on the side 24 via corresponding electrical contacts 34 (only visible in FIGS. 5 and 6) that extend through the substrate 16 from the corresponding electrical contact 30 to the corresponding electrical contact 32.

The substrate 16 may be a flexible substrate or a rigid substrate. The substrate 16 may be fabricated from and/or include any material(s), such as, but not limited to, ceramic, epoxy-glass, polyimide (such as, but not limited to, Kapton® and/or the like), organic material, plastic, polymer, and/or the like. In some embodiments, the substrate 16 is a rigid substrate fabricated from epoxy-glass, such that the base printed circuit 12 is what is sometimes referred to as a "circuit board". In the exemplary embodiment, the substrate 16 includes only a single layer. Alternatively, the substrate 16 may include any number of layers greater than one layer. For example, the substrate 16 may include two exterior layers that each defines one of the sides 22 and 24, with one or more interior layers sandwiched between the exterior layers. Each interior layer of the substrate 16 may include electrical contacts (not shown) and/or electrical traces (not shown) thereon. The electrical contacts and/or electrical traces on interior layers of the substrate 16 may electrically connect some or all of the electrical contacts 30 on the side 22 with the corresponding electrical contacts 32 on the side 24. In addition or alternatively, the electrical contacts and/or electrical traces on interior layers of the substrate 16 may electrically connect some or all of the electrical contacts 30 and/or 32 to any other location on or within the substrate 16 (such as, but not limited to, any location on any layer, including the same layer, of the substrate 16). In some embodiments, the exterior surface 26, and thus the side 22, may include one or more electrical traces (not shown) that electrically connects two or more of the electrical contacts 30 together and/or that electrically connects one or more of the electrical contacts 30 to another location on or within the substrate 16 (such as, but not limited to, any location on any layer, including the same layer, of the substrate 16). Moreover, in some embodiments, the exterior surface 28, and thus the side 24, may include one or more electrical traces (not shown) that electrically connects two or more of the electrical contacts 32 together and/or that electrically connects one or more of the electrical contacts 32 to another location on or within the substrate 16 (such as, but not limited to, any location on any layer, including the same layer, of the substrate 16). Further, and for example, one or more layers of the substrate 16 is optionally a ground plane.

Although not shown, the substrate 16 may include one or more electrical components (not shown) thereon. Each of the electrical components may be active or passive. Examples of active electrical components include, but are not limited to, processors, amplifiers, and/or the like. Examples of passive electrical components include, but are not limited to, resistors, capacitors, inductors, diodes, and/or the like. Each of the electrical components may be electrically connected to one or more of the electrical contacts 30, the electrical contacts 32, and/or any electrical traces of the substrate 16.

Each of the electrical contacts 30 and 32 may conduct electrical signals, electrical ground, and/or electrical power. Moreover, the pattern of the electrical contacts 30 on the side 22 and the pattern of the electrical contacts 32 on the side 24 are each exemplary only. The electrical contacts 30 may be arranged in any other pattern on the side 22 than is shown and/or described herein. Similarly, the electrical contacts 32 may be arranged in any other pattern on the side 24 than is shown and/or described herein. For example, the electrical contacts 30 may have any spacing, or pitch, relative to each other, and the electrical contacts 32 may have any spacing, or pitch, relative to each other. Moreover, although no exemplary pattern is described or shown herein, the electrical contacts 30 and 32 may each be arranged on the respective side 22 and 24 in any pattern of signal, ground, and/or power contacts.

Although in the exemplary embodiment each of the electrical contacts 30 and 32 is an electrically conductive pad, each electrical contact 30 and 32 may include any other size, shape, geometry, and/or the like. In some embodiments, the electrical contacts 30 and/or 32 are integrally formed with the corresponding electrical contact 34. Moreover, in some embodiments exterior surfaces of one or more of the electrical contacts 34 that extend along the side 22 define one or more of the corresponding electrical contacts 30 such that such electrical contacts 30 do not extend on the exterior surface 26. Similarly, in some embodiments exterior surfaces of one or more of the electrical contacts 34 that extend along the side 24 define one or more of the corresponding electrical contacts 32 such that such electrical contacts 32 do not extend on the exterior surface 28.

Figure 6:
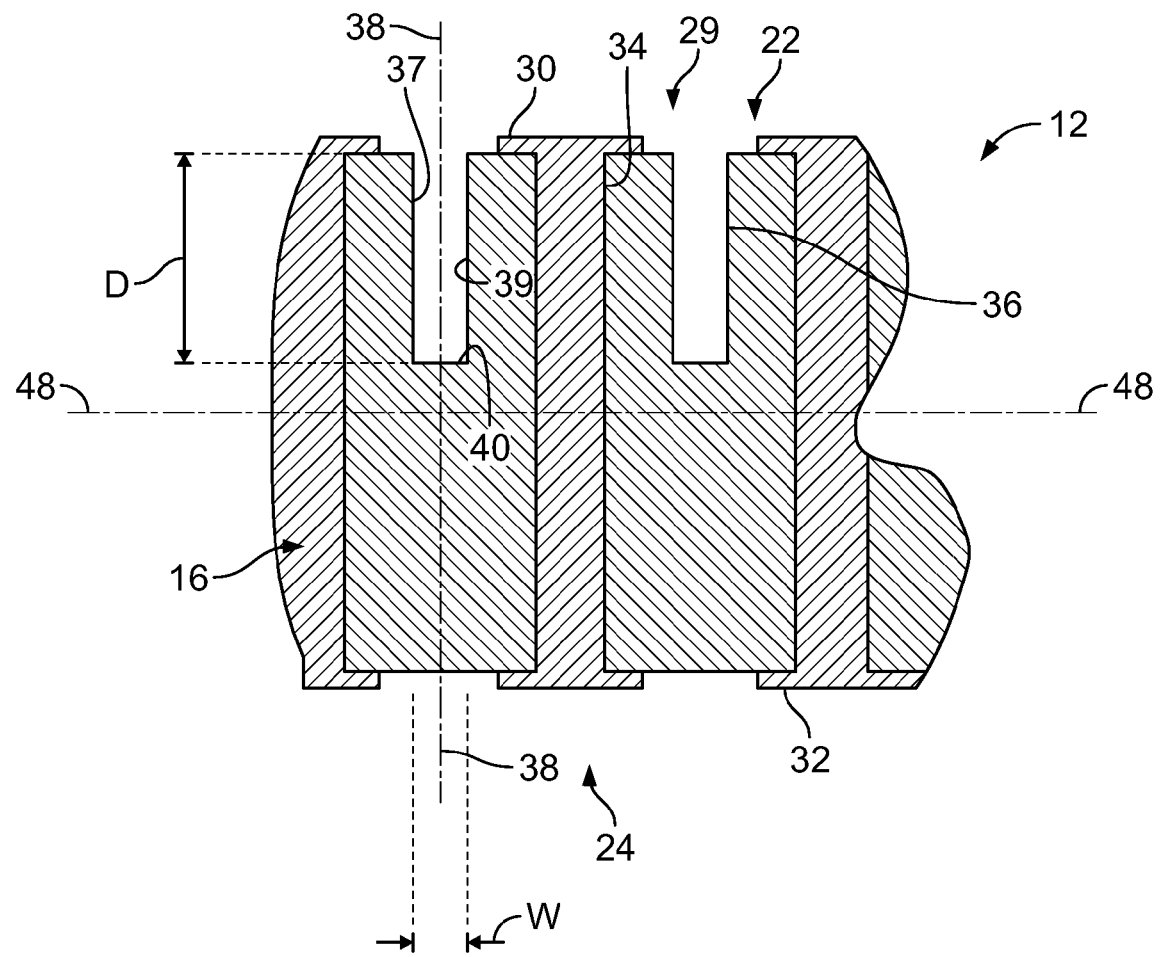
FIG. 6 is an enlarged cross-sectional view of a portion of the cross-section of the base printed circuit shown in FIG. 5.

FIG. 6 is a detail view of a portion of the cross-section of the base printed circuit 12 shown in FIG. 5. As can be seen in FIGS. 2, 3, 5, and 6, the substrate 16 optionally includes a plurality of slots 36 that extend within the side 22. Specifically, each of the slots 36 extends through the side 22 and into the substrate 16. The slots 36 extend on the printed circuit receiving area 29 of the base printed circuit 12. In the exemplary embodiment, each slot 36 includes a corresponding row of the electrical contacts 30 adjacent thereto. Referring to FIG. 6, each slot 36 includes a pair of side walls 37 and 39 that extend a depth D along a central depth axis 38 to a bottom 40. Each slot 36 includes a width W. Referring to FIGS. 2 and 3, each slot 36 extends a length $L_1$ along the substrate 16 between a pair of opposite end portions 42 and 44. As will be described below, each slot 36 is configured to receive a mating edge 46 (FIGS. 1, 7, 8, and 9) of a corresponding one of the secondary printed circuits 14 (FIGS. 1, 7, 8, and 9) therein to facilitate mounting the secondary printed circuits 14 on the base printed circuit 12. Although six slots 36 are shown for mounting six secondary printed circuits 14 on the base printed circuit 12, the substrate 16 may include any number of slots 36 for receiving any number of secondary printed circuits 14.

Referring to FIG. 6, each slot 36 may have any depth D for receiving any amount of the corresponding secondary printed circuit 14 therein. In some embodiments, the depth D of one or more slots 36 is different than the depth D of one or more other slots 36. Each slot 36 may also have any width W for receiving a secondary printed circuit 14 having any thickness. In some embodiments, the width W of one or more slots 36 is different than the width W of one or more other slots 36.

In the exemplary embodiment, the central depth axis 38 of each slot 36 extends approximately perpendicular relative to a central plane 48 of the substrate 16. Alternatively, the central depth axis 38 of each slot 36 may extend at any other non-parallel angle relative to the central plane 48. In some embodiments, the central depth axis 38 of one or more slots 36 extends at a different angle relative to the central plane 48 of the substrate 16 than the central depth axis 38 of one or more other slots 36.

As can be seen in FIGS. 2 and 3, the length $L_1$ of each of the slots 36 is equal to the length L of the substrate 16 such that each slot 36 extends completely through both of the end portions 18 and 20. Accordingly, the end portions 42 and 44 of each of the slots 36 are open. The open end portions 42 and/or 44 may facilitate insertion of the secondary printed circuits 14 within the slots 36. Moreover, the open end portions 42 and/or 44 may facilitate mounting secondary printed circuits 14 that have a length $L_2$ (FIGS. 7 and 8) that is greater than the length L of the base printed circuit 12 and/or may facilitate mounting secondary printed circuits 14 in orientations wherein a portion of the secondary printed circuit extends past one of the end portions 18 and 20 of the base printed circuit 12. Furthermore, the open end portions 42 and/or 44 may enable the secondary printed circuits 14 to move within the corresponding slot 36 along the length of the corresponding slot 36 to facilitate aligning secondary contacts 70 (FIGS. 1 and 7-9) of the secondary printed circuits 12 with the corresponding electrical contacts 30 of the base printed circuit 12. In alternative embodiments, the end portion 42 and/or 44 of one or more of the slots 36 is closed. Closed end portions 42 and/or 44 may facilitate holding a secondary printed circuit 14 within the corresponding slot 36 during assembly, for example when the base printed circuit 12 is held in an approximately non-horizontal orientation during assembly.

Figure 7:
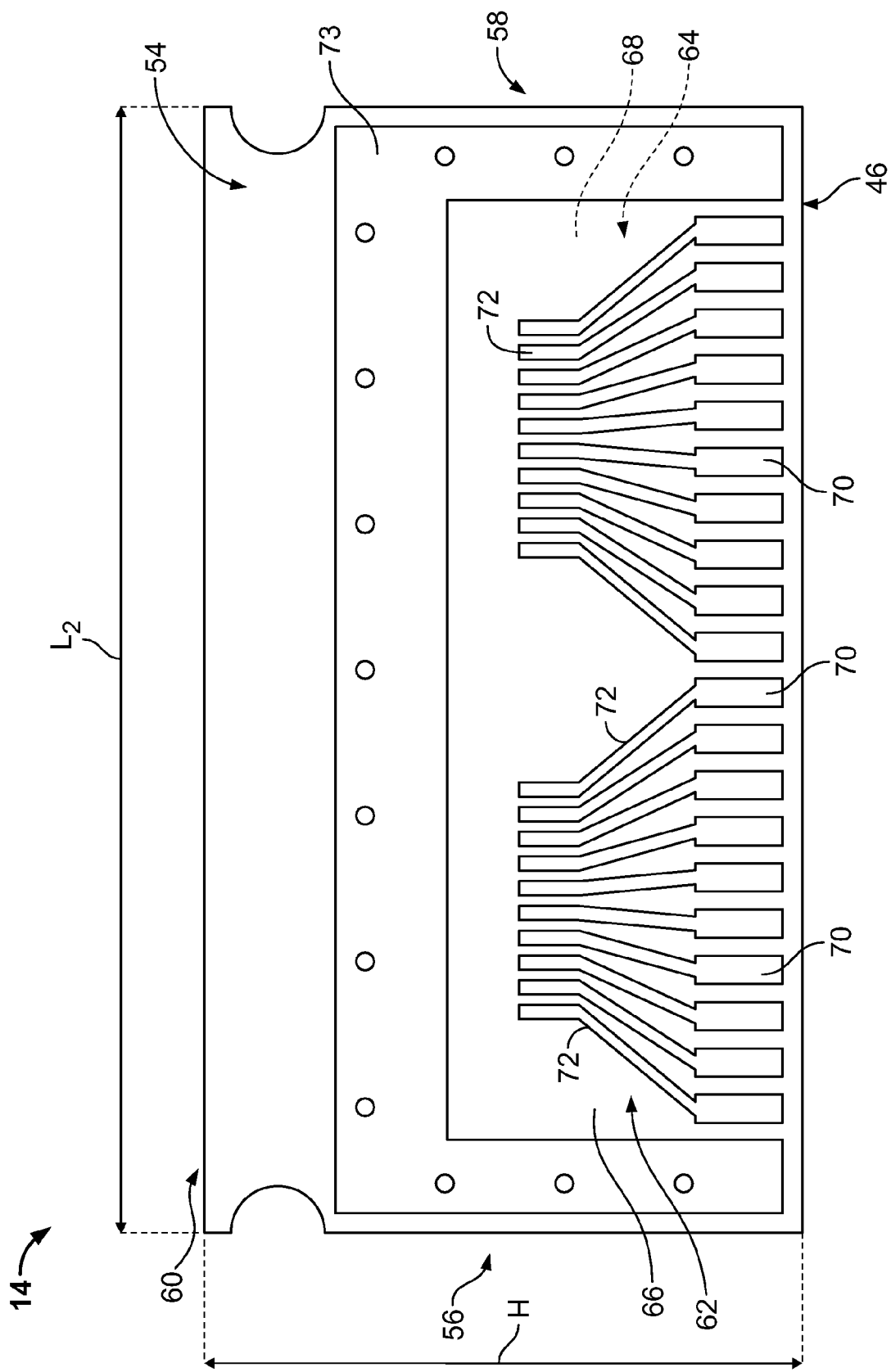
FIG. 7 is an elevational view of an exemplary embodiment of a secondary printed circuit of the printed circuit assembly shown in FIG. 1.
Figure 8:
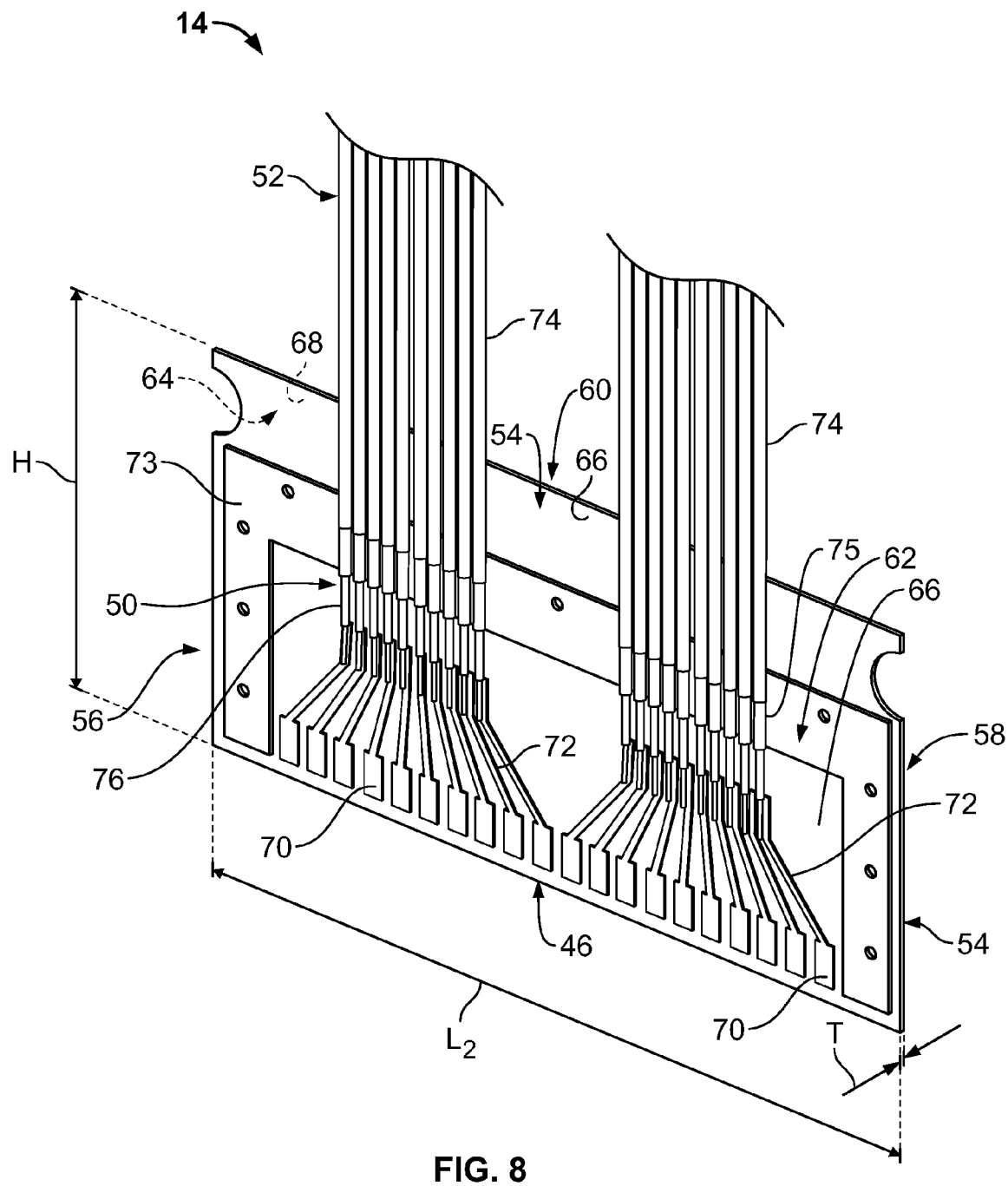
FIG. 8 is a perspective view of the secondary printed circuit shown in FIG. 7 illustrating the secondary printed circuit terminating the end of an exemplary cable.
Figure 9:
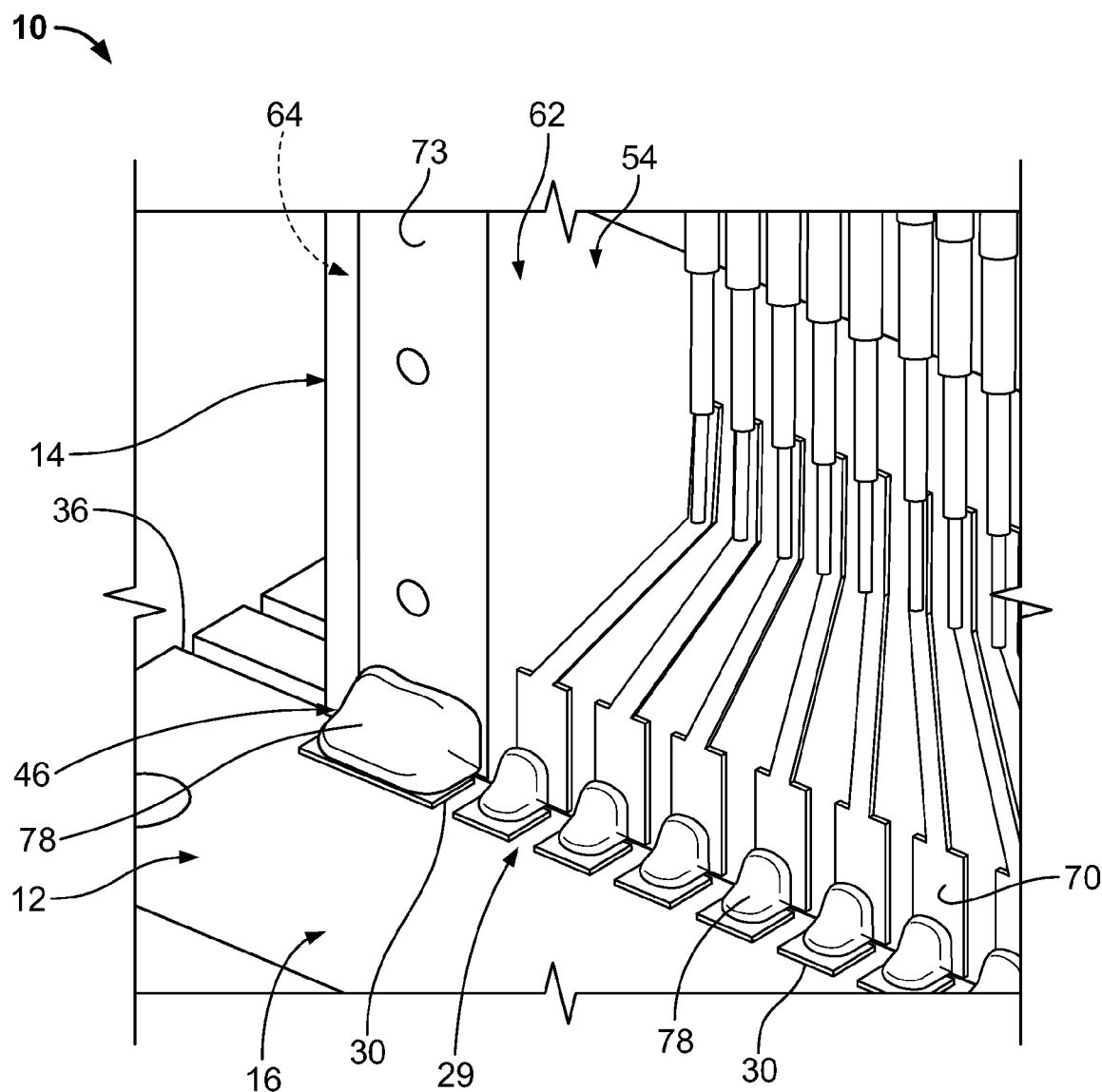
FIG. 9 is an enlarged perspective view of a portion of the printed circuit assembly shown in FIG. 1.

FIG. 7 is an elevational view of an exemplary embodiment of a secondary printed circuit 14 of the printed circuit assembly 10 (FIGS. 1 and 9). FIG. 8 is a perspective view of the secondary printed circuit 14 illustrating the secondary printed circuit 14 terminating the end 50 of an exemplary cable 52. The secondary printed circuit 14 includes a substrate 54 extending the length $L_2$ from an edge 56 to an opposite edge 58 and extending a height H from the mating edge 46 to a cable-receiving edge 60. The substrate 54 includes a thickness T, which is not visible in FIG. 7. The substrate 54 includes a pair of opposite sides 62 and 64. Each side 62 and 64 includes a respective exterior surface 66 and 68. In the exemplary embodiment, only the exterior surface 66, and thus only the side 62, includes a plurality of secondary contacts 70 and a plurality of secondary traces 72 thereon. In the exemplary embodiment, the secondary contacts 70 extend along the mating edge 46 of the substrate 54. In the exemplary embodiment, each secondary trace 72 extends from a corresponding one of the secondary contacts 70 generally toward the cable-receiving edge 60 for electrically connecting the secondary contacts 70 to one or more corresponding electrical components. The side 62 also includes a secondary ground contact 73. In alternative embodiments, each of the exterior surfaces 66 and 68, and thus each side 62 and 64, includes a plurality of secondary contacts and/or a plurality of secondary traces extending thereon.

As described above and will be described below, the mating edge 46 of the substrate 54 is configured to be received within a corresponding one of the slots 36 (FIGS. 2, 3, 5, and 6) of the base printed circuit 12. As will be described below, each secondary contact 70 is configured to be electrically connected a corresponding electrical contact 30 (FIGS. 1-3, 5, and 6) of the base printed circuit 12 (FIGS. 1-6) when the secondary printed circuit 14 is mounted on the base printed circuit 12. Although twenty are shown herein, each secondary printed circuit 14 may include any number of secondary contacts 70 for electrical connection to any number of the electrical contacts 30 of the base printed circuit 12.

In the exemplary embodiment, and as shown in FIGS. 1 and 8, the electrical components are cables 52 and each secondary printed circuit 14 mounted on the base printed circuit 12 terminates the end 50 of two of the cables 52. Specifically, the cable-receiving edge 60 of the secondary printed circuit 14 receives the cables 52. Each cable 52 includes a plurality of electrical leads 74. In the exemplary embodiment, each electrical lead 74 is a coaxial cable. The cable-receiving edge 60 receives each of the electrical leads 74 thereon. Each electrical lead 74 includes an electrical conductor 76 that is electrically connected, or terminated, to a corresponding one of the secondary traces 72. Accordingly, each electrical lead 74 is electrically connected to a corresponding one of the secondary contacts 70. Moreover, each electrical lead 74 includes an electrical ground conductor 75 that is directly engaged with, and thereby electrically connected to, the secondary ground contact 73 of the secondary printed circuit 114.

Although each secondary printed circuit 14 is shown as terminating the end 50 of two cables 52, each secondary printed circuit 14 mounted on the base printed circuit 12 may terminate any number of cables 52. Moreover, in some embodiments one or more of the electrical leads 74 directly engages the corresponding secondary contact 70 such that the corresponding secondary trace 72 is eliminated. Although each cable 52 is shown as having ten electrical leads 74, each cable 52 may have any number of electrical leads 74. Moreover, in alternative embodiments one or more of the electrical leads 74 is not bundled with other electrical leads 74 in a larger cable, whether or not each electrical lead 74 is a coaxial cable. In addition or alternatively to terminating one or more cables 52, one or more of the secondary printed circuits 14 mounted on the base printed circuit 12 may be electrically connected to, and/or may form a component of, one or more of any other type of electrical components besides a cable.

Referring again to FIGS. 7 and 8, each of the secondary contacts 70 and each of the secondary traces 72 may conduct electrical signals, electrical ground, and/or electrical power. Moreover, the pattern of the secondary contacts 70 and the pattern of the secondary traces 72 on the side 62 are each exemplary only. In the exemplary embodiment, the secondary traces 72 are arranged in a fanned pattern that fans outwardly as the secondary traces extend toward the cable-receiving edge 60. The secondary contacts 70 and the secondary traces 72 may each be arranged in any other pattern on the side 62 than is shown and/or described herein. For example, the secondary contacts 70 may have any spacing, or pitch, relative to each other. Moreover, and for example, the width and/or length of each secondary trace 72 may be selected and/or arranged relative to other secondary traces 72 to facilitate optimizing signal integrity (such as, but not limited to, crosstalk, skew, capacitance, and/or the like). In some embodiments, adjacent pairs of secondary contacts 70 of one or more of the secondary printed circuits 14 have a different pitch than one or more other adjacent pairs of secondary contacts 70 of the same secondary printed circuit 14. Moreover, in some embodiments one or more of the adjacent pairs of secondary contacts 70 of one or more secondary printed circuits 14 have a different pitch than one or more adjacent pairs of secondary contacts 70 of one or more other secondary printed circuits 14 mounted on the base printed circuit 12. Moreover, although no exemplary pattern is described or shown herein, the secondary contacts 70 and the secondary traces 72 may each be arranged on the side 62 in any pattern of signal, ground, and/or power contacts/traces. Although in the exemplary embodiment each of the secondary contacts 70 is an electrically conductive pad, each secondary contact 70 may include any other size, shape, geometry, and/or the like.

The substrate 54 may be a flexible substrate or a rigid substrate. The substrate 54 may be fabricated from and/or include any material(s), such as, but not limited to, ceramic, epoxy-glass, polyimide (such as, but not limited to, Kapton® and/or the like), organic material, plastic, polymer, and/or the like. In some embodiments, the substrate 54 is a rigid substrate fabricated from epoxy-glass, such that the secondary printed circuit 14 is what is sometimes referred to as a "circuit board". In the exemplary embodiment, the substrate 54 includes only a single layer. Alternatively, the substrate 54 may include any number of layers greater than one layer. For example, the substrate 54 may include two exterior layers that each defines one of the sides 62 and 64, with one or more interior layers sandwiched between the exterior layers. Each interior layer of the substrate 54 may include electrical contacts (not shown) and/or electrical traces (not shown) thereon. The electrical contacts and/or electrical traces on interior layers of the substrate 54 may electrically connect some or all of the secondary contacts 70 and/or secondary traces 72 to any location on or within the substrate 54 (such as, but not limited to, any location on any layer, including the same layer, of the substrate 54). One or more layers of the substrate 54 is optionally a ground plane. The substrate 54 may be referred to herein as a "secondary substrate".

Although not shown, the substrate 54 may include one or more electrical components (not shown) thereon. Each of the electrical components may be active or passive. Examples of active electrical components include, but are not limited to, processors, amplifiers, and/or the like. Examples of passive electrical components include, but are not limited to, resistors, capacitors, inductors, diodes, and/or the like. Each of the electrical components may be electrically connected to one or more of the secondary contacts 70 and/or the secondary traces 72.

Each secondary printed circuit 14 mounted on the base printed circuit 12 may have any height H. In some embodiments, the height H of one or more secondary printed circuits 14 is different than the height H of one or more other secondary printed circuits 14 mounted on the base printed circuit 12. The mating edge 46 of each secondary printed circuit 14 mounted on the base printed circuit 12 may also have any thickness T for being received within any width W (FIG. 6) of the corresponding slot 36. In some embodiments, the thickness T of the mating edge 46 of one or more secondary printed circuits 14 is different than the thickness T of the mating edge 46 of one or more other secondary printed circuits 14 mounted on the base printed circuit 12.

FIG. 9 is an enlarged perspective view of a portion of the printed circuit assembly 10 shown in FIG. 1. Referring now to FIGS. 1 and 9, to mount each of the secondary printed circuits 14 on the base printed circuit 12, the substrate 54 of the secondary printed circuit 14 is directly engaged with the substrate 16 of the base printed circuit 12 at the printed circuit receiving area 29 of the base printed circuit 12. Specifically, in the exemplary embodiment the mating edge 46 of the secondary printed circuit 14 is inserted into the corresponding slot 36 within the base printed circuit 12. In the exemplary embodiment, the mating edge 46 of the secondary printed circuit 14 thereby directly engages the base printed circuit 12 at the bottom 40 (FIG. 6) and/or the side walls 37 and/or 39 (FIG. 6) of the corresponding slot 36. The slots 36 facilitate mechanically stabilizing the secondary printed circuit 14 relative to the base printed circuit 12. Each secondary contact 70 of the secondary printed circuit 14 is electrically connected to the corresponding electrical contact(s) 30 of the base printed circuit 12 using an electrical bonding material 78. Moreover, the secondary ground contact 73 of the secondary printed circuit 14 is electrically connected to corresponding ones of the electrical contacts 30 using the electrical bonding material 78. The electrical bonding material 78 may be any material that establishes an electrical connection between the secondary contacts 70 and the corresponding electrical contacts 30 and 70 and between the secondary ground contact 73 and the corresponding electrical contacts 30, such as, but not limited to, solder, electrically conductive epoxy, wire bonding, electrically conductive adhesive, welding material, and/or the like.

The secondary printed circuit 14 is mounted on, including being electrically connected to, the base printed circuit 12 without the use of an intervening electrical connector assembly (not shown). For example, the secondary printed circuit 14 is mounted on, including being electrically connected to, the base printed circuit 12 without using an intervening electrical connector assembly that includes a housing (not shown) and a plurality of electrical contacts (not shown) that extend between, and electrically connect, the electrical contacts 30 and the secondary contacts 70.

In addition to the electrical bonding material 78 (and in addition or alternative to the slots 36), the printed circuit assembly 10 may include any other structure, means, and/or the like that facilitates mechanically holding, stabilizing, connecting, mounting, attaching, and/or the like the secondary printed circuits 14 on the base printed circuit 12, such as, but not limited to, potting, combs, other mechanical elements (such as, but not limited to, snap connections, interference connections, locks, latches, and/or the like), and/or the like.

In the exemplary embodiment, only the side 22 of the base printed circuit 12 includes the secondary printed circuits 14 mounted thereon. Alternatively, the side 24 of the base printed circuit 12 includes one or more secondary printed circuits 12 mounted thereon, including being electrically connected to one or more of the electrical contacts 32 on the side 24 (such as, but not limited to, via the electrical bonding material 78).

In the exemplary embodiment, the height H of each of the secondary printed circuits 14 is approximately the same and the depth D (FIG. 6) of each of the slots 36 is approximately the same. In alternative embodiments, the height H of one or more of the secondary printed circuits 14 is different than the height H of one or more other secondary printed circuits 14 and/or the depth D of one or more of the slots 36 is different than one or more other slots 36. Varying the height H of the secondary printed circuits 14 relative to each other and/or varying the depth D of the slots relative to each other may enable easier access to the electrical conductors 76 of the electrical leads 74 and the secondary traces 72 (for electrical connection therebetween) even after one or more of the secondary printed circuits 14 has been electrically connected to the base printed circuit 12.

In some embodiments, one or more of the secondary printed circuits 14 is electrically connected to one or more other secondary printed circuits 14 via the base, printed circuit 12. For example, in some embodiments the base printed circuit 12 provides a common ground plane for two or more of the secondary printed circuits 14. Moreover, and for example, one or more of the secondary printed circuits 14 may provide a signal and/or power input to the base printed circuit 12 while one or more other secondary printed circuits 14 provides an associated signal and/or power output from the base printed circuit 12.

Although only one base printed circuit 12 is shown, in some embodiments one or more of the secondary printed circuits 14 is mounted on, including being electrically connected to, more than one base printed circuit 12. For example, in some embodiments, in addition to being mounted on the base printed circuit 12 at the mating edge 46 as shown, one or more of the secondary printed circuits 14 is mounted on, including being electrically connected to, another base printed circuit 12 at the cable-receiving edge 60. Moreover, and for example, the mating edge 46 of one or more of the secondary printed circuits 14 may be mounted on, including being electrically connected to, one or more other base printed circuits 12 in addition to the base printed circuit 12 shown (such as, but not limited to, two or more base printed circuits 12 arranged generally in the same plane as each other).

In the exemplary embodiment, the height H (FIGS. 7 and 8) of each of the secondary printed circuits 14 extends approximately perpendicular relative to the central plane 48 (FIG. 6) of the substrate 16. Accordingly, in the exemplary embodiment the height H of each of the secondary printed circuits 14 extend approximately parallel to each other. In alternative embodiments, the height H of each secondary printed circuit 14 may extend at any other non-parallel angle relative to the central plane 48. In some embodiments, the height H of one or more secondary printed circuits 14 extends at a different angle relative to the central plane 48 of the base printed circuit 12 than the height H of one or more other secondary printed circuits 14 that are mounted on the base printed circuit 12.

Figure 10:
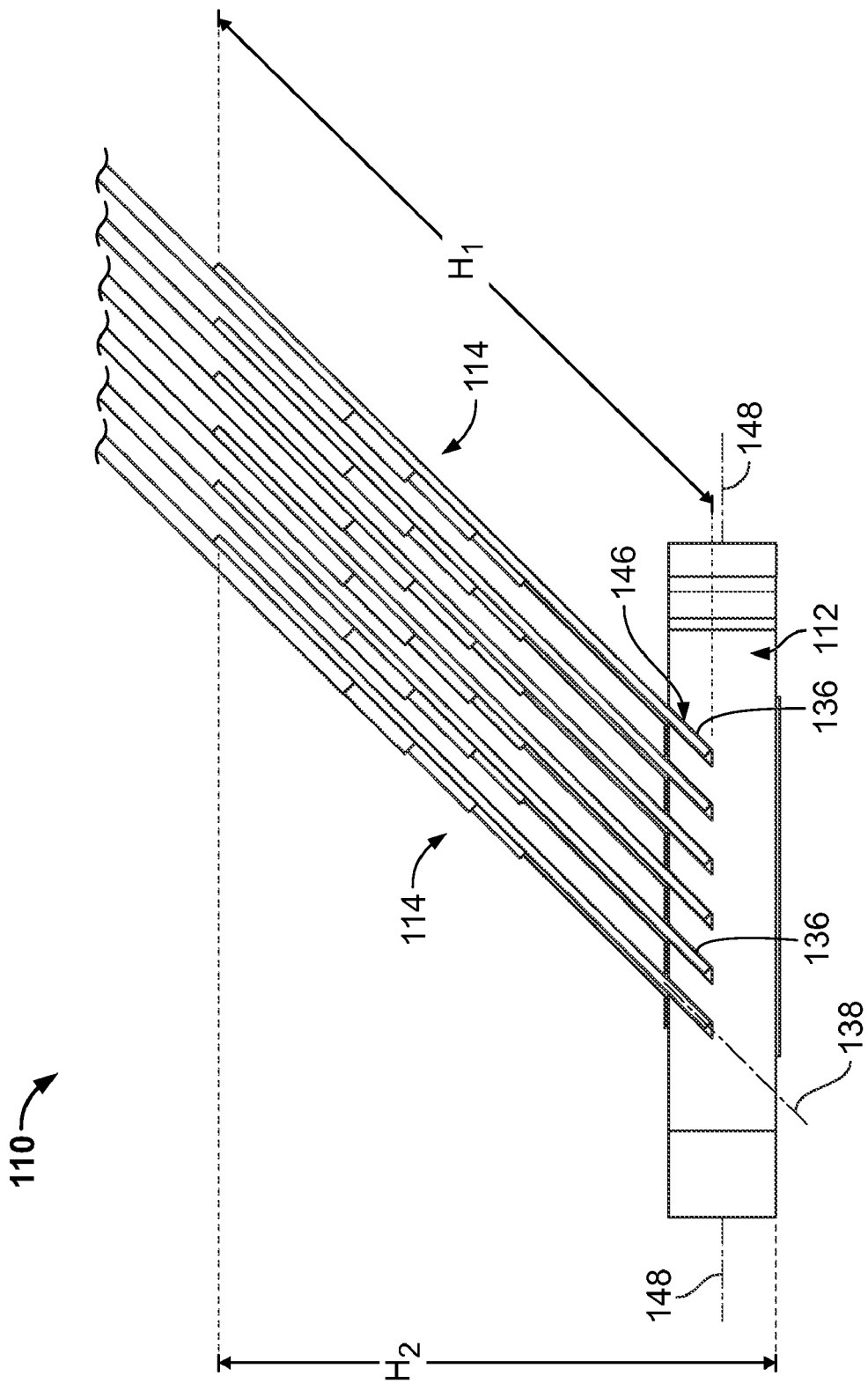
FIG. 10 is an elevational view of an exemplary alternative embodiment of a printed circuit assembly.

FIG. 10 is an elevational view of an exemplary alternative embodiment of a printed circuit assembly 110. The printed circuit assembly 110 includes a base printed circuit 112 and a plurality of secondary printed circuits 114. Each of the secondary printed circuits 114 is mounted on the base printed circuit 112 such that the secondary printed circuit 114 is electrically connected to the base printed circuit 112. The base printed circuit 112 includes a plurality of slots 136 that each receives a mating edge 146 of a corresponding one of the secondary printed circuits 14. Each slot 136 extends into the base printed circuit 12 along a central depth axis 138. The central depth axis 138 of each slot 136 extends at an approximately 45° angle relative to a central plane 148 of the base printed circuit 12. Accordingly, a height $H_1$ of each of the secondary printed circuits 114 extends at an approximately 45° angle relative to the central plane 148 of the base printed circuit 112. The height $H_1$ of each of the secondary printed circuits 114 extend approximately parallel to each other. Tilting the secondary printed circuits 114 such that the height $H_1$ of each of the secondary printed circuits 114 extends at a non-parallel and non-perpendicular angle relative to the central plane 148 of the base printed circuit 112 may facilitate reducing an overall height $H_2$ of the printed circuit assembly 110.

Alternatively, the central depth axis 138 of each slot 136 may extend at any other non-parallel and non-perpendicular angle relative to the central plane 148 such that the height $H_1$ of each of the secondary printed circuits 114 extends at any other non-parallel and non-perpendicular angle relative to the central plane 148. In some embodiments, the central depth axis 138 of one or more slots 136 extends at a different angle relative to the central plane 148 of the base printed circuit 112 than the central depth axis 138 of one or more other slots 136. Accordingly, in some embodiments, the height $H_1$ of one or more of the secondary printed circuits 114 extends at a different angle relative to the central plane 148 of the base printed circuit 112 than the height $H_1$ of one or more other secondary printed circuits 114.

Figure 11:
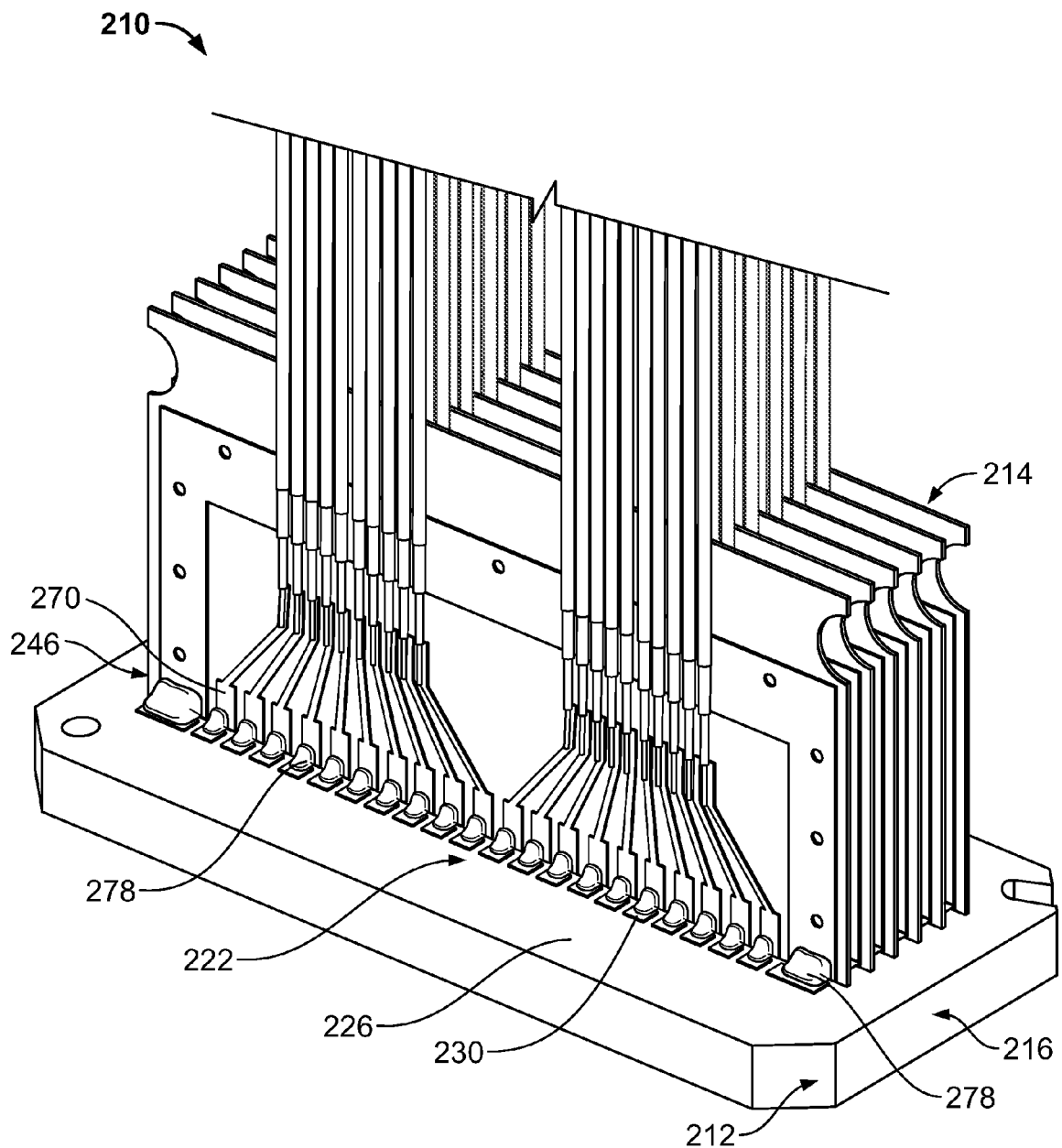
FIG. 11 is a perspective view of another exemplary alternative embodiment of a printed circuit assembly.

Referring again to FIGS. 1 and 9, and as described above, the slots 36 (and the slots 136) are optional such that the base printed circuit 12 may not include one or more of the slots 36. FIG. 11 is a perspective view of another exemplary alternative embodiment of a printed circuit assembly 210. The printed circuit assembly 210 includes a base printed circuit 212 and a plurality of secondary printed circuits 214. Each of the secondary printed circuits 214 is mounted on the base printed circuit 212 such that the secondary printed circuit 214 is electrically connected to the base printed circuit 212. Specifically, the base printed circuit 212 includes a substrate 216 having a side 222 that includes an exterior surface 226. A plurality of electrical contacts 230 extend on the exterior surface 226. Each secondary printed circuit 214 includes a mating edge 246 having a plurality of secondary contacts 270 arranged therealong. The base printed circuit 212 does not include any slots similar to the slots 36 (FIGS. 1-3, 5, 6, and 9) or 136 (FIG. 10). Rather, the mating edge 246 of each secondary printed circuit 214 directly engages the exterior surface 226 of the base printed circuit 212. Each secondary contact 270 of the secondary printed circuits 214 is electrically connected to the corresponding electrical contact 230 of the base printed circuit 212 via an electrical bonding material 278.

In such an embodiment wherein the base printed circuit 212 does not include any slots similar to the slots 36 (FIGS. 1-3, 5, 6, and 9) or 136 (FIG. 10), the electrical bonding material 278 may facilitate providing mechanical stability between the base printed circuit 212 and the secondary printed circuits 214.

Figure 12:
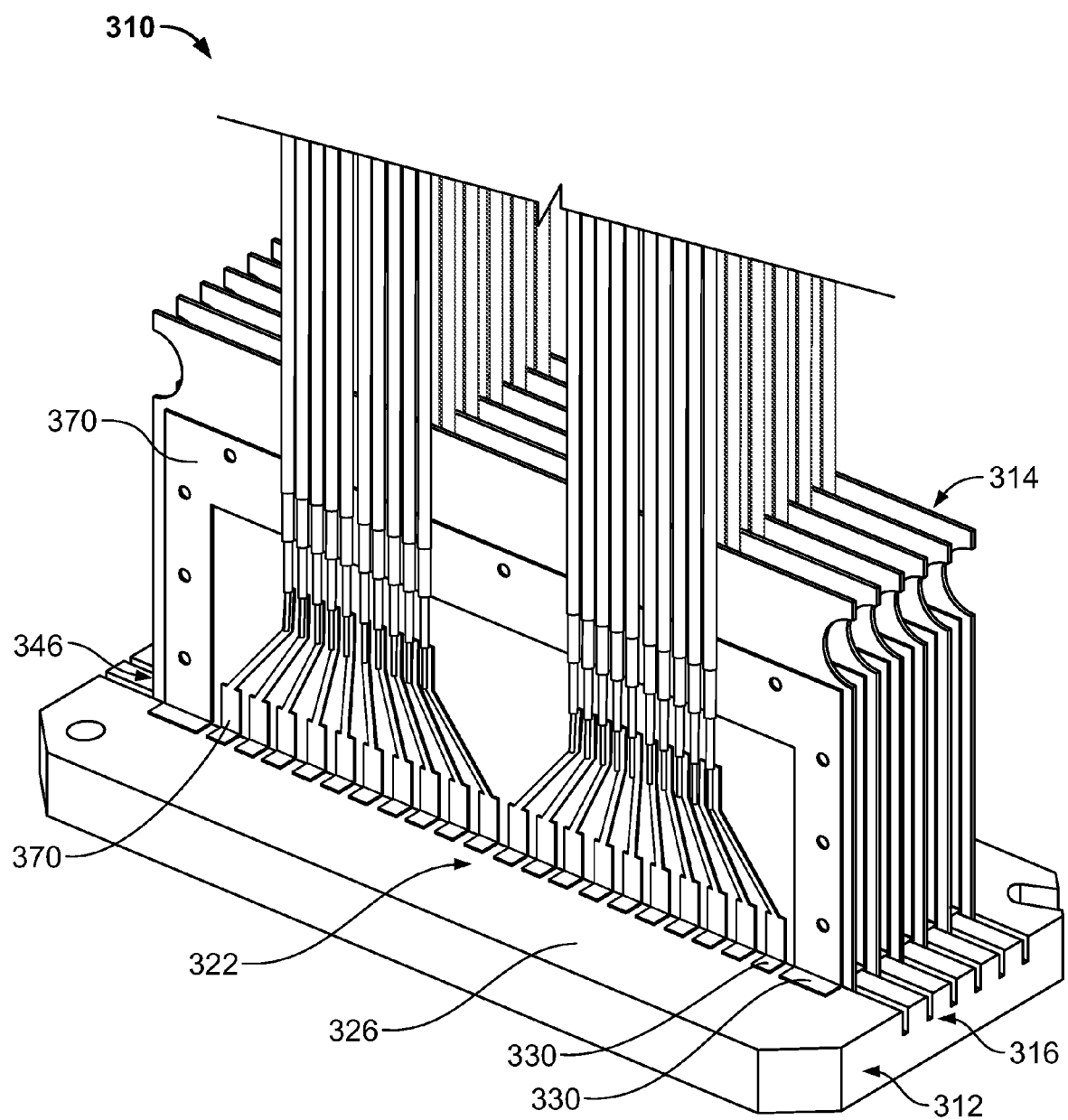
FIG. 12 is a perspective view of another exemplary alternative embodiment of a printed circuit assembly.

FIG. 12 is a perspective view of another exemplary alternative embodiment of a printed circuit assembly 310. The printed circuit assembly 310 includes a base printed circuit 312 and a plurality of secondary printed circuits 314. Each of the secondary printed circuits 314 is mounted on the base printed circuit 312 such that the secondary printed circuit 314 is electrically connected to the base printed circuit 312. Specifically, the base printed circuit 312 includes a substrate 316 having a side 322 that includes an exterior surface 326. A plurality of electrical contacts 330 extend on the exterior surface 326. Each secondary printed circuit 314 includes a mating edge 346 having a plurality of secondary contacts 370 arranged therealong. Each secondary contact 370 of the secondary printed circuits 314 directly engages the corresponding electrical contact(s) 330 of the base printed circuit 312 to establish an electrical connection therebetween.

Figure 13:
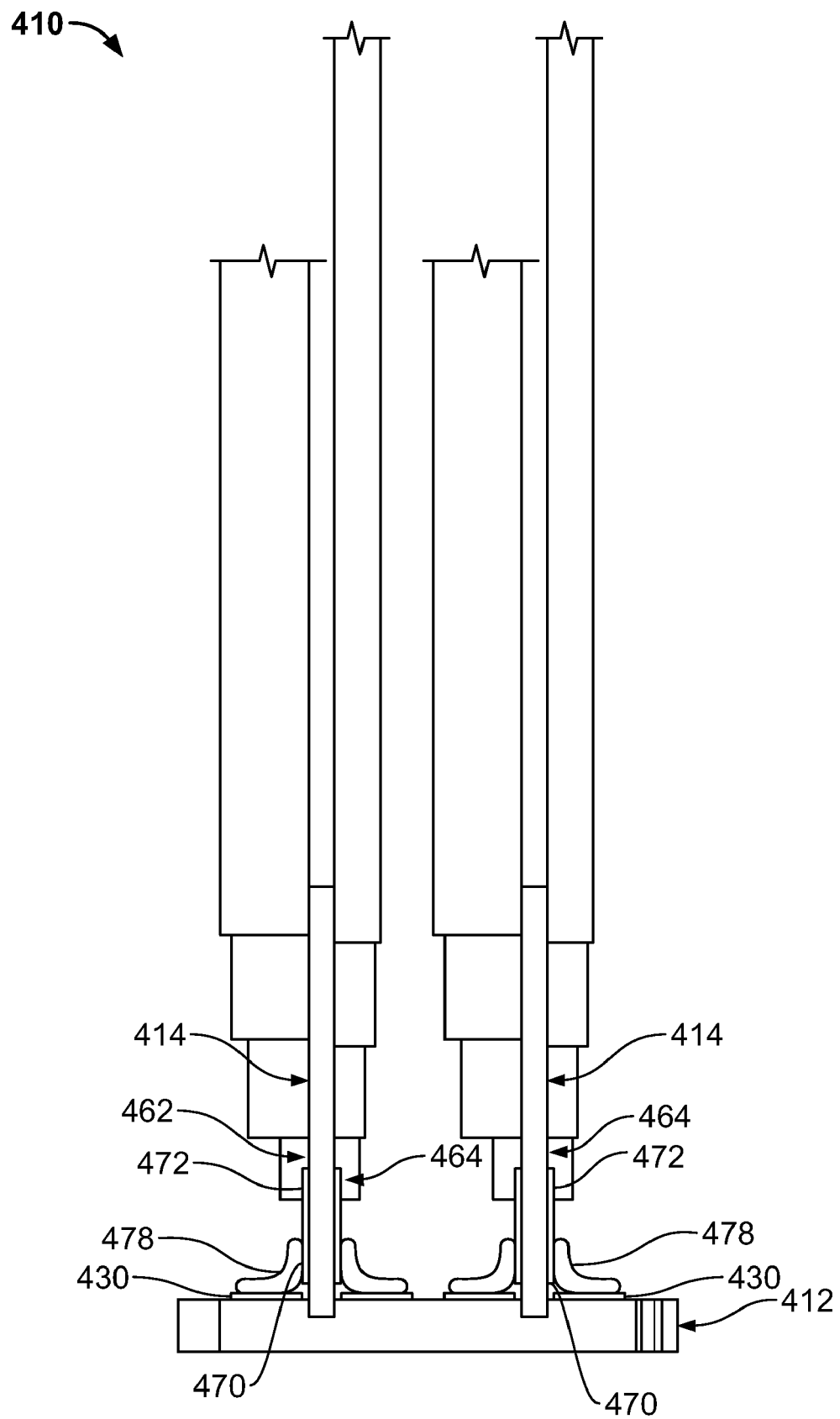
FIG. 13 is an elevational view of another exemplary alternative embodiment of a printed circuit assembly.

Referring again to FIGS. 1 and 9, in the exemplary embodiment only one of the sides 62 of each of the secondary printed circuits 14 is electrically connected to the base printed circuit 12. Alternatively, the side 64 of one or more of the secondary printed circuits 12 is also electrically connected to the base printed circuit 12. For example, FIG. 13 is an elevational view of another exemplary alternative embodiment of a printed circuit assembly 410. The printed circuit assembly 410 includes a base printed circuit 412 and a plurality of secondary printed circuits 414. Each of the secondary printed circuits 414 is mounted on the base printed circuit 412 such that the secondary printed circuit 414 is electrically connected to the base printed circuit 412. Specifically, a side 462 of each of the secondary printed circuits 414 includes one or more secondary contacts 470 and/or one or more secondary traces 472 that are each electrically connected to corresponding electrical contacts 430 on the base printed circuit 412 (such as, but not limited to, via electrical bonding material 478). Similarly, an opposite side 464 of one or more of the secondary printed circuits 414 includes one or more secondary contacts 470 and/or one or more secondary traces 472, wherein some or all of the secondary contacts 470 and/or the secondary traces 472 on the side 464 are electrically connected to corresponding electrical contacts 430 on the base printed circuit 412 (such as, but not limited to, via the electrical bonding material 478).

The embodiments described and/or illustrated herein may enable an increase of the density of electrical contacts at the interconnection between printed circuits without decreasing signal integrity. For example, the embodiments described and/or illustrated herein may provide connection of a printed circuit that terminates an increased number of electrical leads and/or coaxial cables to another printed circuit without decreasing signal integrity. Moreover, the embodiments described and/or illustrated herein may facilitate adding functionality (such as, but not limited to, passive and/or active electrical components, and/or the like) to a printed circuit without decreasing signal integrity and/or may facilitate increasing a density and/or a number of electrical contacts on a printed circuit without decreasing signal integrity. For example, the embodiments described and/or illustrated herein may facilitate eliminating an intervening electrical connector assembly, which may free up space on the printed circuit that would otherwise be occupied by the electrical connector assembly.

Although the subject matter described and/or illustrated herein is described and illustrated with regard to electrically connecting a printed circuit that terminates one or more cables, one or more electrical leads, and/or one or more coaxial cables to another printed circuit, the subject matter described and/or illustrated herein is applicable to electrically connecting any printed circuits together, whether or not any of the printed circuits terminate any cables, electrical leads, coaxial cables.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the description and illustrations. The scope of the subject matter described and/or illustrated herein should therefore be determined with reference to the appended claims, along with the full scope of equivalents to which such claims are entitled. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

While the subject matter described and/or illustrated herein has been described in terms of various specific embodiments, those skilled in the art will recognize that the subject matter described and/or illustrated herein can be practiced with modification within the spirit and scope of the claims.

What is claimed is:

1. A printed circuit assembly comprising:
   a base printed circuit having a printed circuit receiving area and a plurality of electrical contacts provided on the printed circuit receiving area; and
   a secondary printed circuit having a secondary substrate including a mating edge and a plurality of secondary contacts provided along the mating edge, the secondary printed circuit being mounted on the base printed circuit such that the mating edge of the secondary printed circuit is directly engaged with the base printed circuit at the printed circuit receiving area, each of the secondary contacts being electrically connected to a corresponding one of the electrical contacts of the base printed circuit, at least one electrical contact of the base printed circuit being electrically connected to the corresponding secondary contact via an electrical bonding material; wherein the secondary printed circuit comprises a cable-receiving edge configured to receive a plurality of coaxial cables, the secondary substrate of the secondary printed circuit having a plurality of secondary traces that are each electrically connected to a corresponding one of the secondary contacts, each of the plurality of coaxial cables being terminated to a corresponding one of the secondary traces.

2. The printed circuit assembly according to claim 1, wherein the printed circuit receiving area of the base printed circuit comprises a slot, the mating edge of the secondary printed circuit being received within the slot.

3. The printed circuit assembly according to claim 1, wherein at least one of:
   at least one of the electrical contacts of the base printed circuit extends on an exterior surface of the base printed circuit; and
   at least one of the secondary contacts of the secondary printed circuit extends on an exterior surface of the secondary printed circuit.

4. The printed circuit assembly according to claim 1, wherein the secondary printed circuit extends at an approximately non-parallel angle relative to the base printed circuit.

5. The printed circuit assembly according to claim 1, wherein the secondary printed circuit extends approximately perpendicular relative to the base printed circuit.

6. The printed circuit assembly according to claim 1, wherein at least one of:
   at least one of the electrical contacts of the base printed circuit comprises an electrically conductive pad; and
   at least one of the secondary contacts of the secondary printed circuit comprises an electrically conductive pad.

7. A printed circuit assembly comprising:
   a base printed circuit having a printed circuit receiving area and a plurality of electrical contacts provided on the printed circuit receiving area; and
   a plurality of secondary printed circuits, each of the secondary printed circuits having a secondary substrate including a mating edge and a plurality of secondary contacts provided along the mating edge, each of the secondary printed circuits being mounted on the base printed circuit such that the secondary substrate of each secondary printed circuit is directly engaged with the base printed circuit at the printed circuit receiving area of the base printed circuit, each of the secondary contacts being electrically connected to a corresponding one of the electrical contacts of the base printed circuit, at least one of the plurality of electrical contacts of the base printed circuit is directly engaged with the corresponding secondary contact of the corresponding secondary printed circuit; wherein each secondary printed circuit comprises a cable-receiving edge configured to receive a plurality of coaxial cables, the secondary substrate of each secondary printed circuit having a plurality of secondary traces that are each electrically connected to a corresponding one of the secondary contacts, each of the plurality of coaxial cables being terminated to a corresponding one of the secondary traces.

8. The printed circuit assembly according to claim 7, wherein the printed circuit receiving area of the base printed circuit comprises a plurality of slots, the mating edge of each of the secondary printed circuits being received within a corresponding one of the slots.

9. The printed circuit assembly according to claim 7, wherein the at least one of the plurality of electrical contacts of the base printed circuit is electrically connected to the corresponding secondary contact of the corresponding secondary printed circuit via an electrical bonding material.

10. The printed circuit assembly according to claim 7, wherein at least one of:
   at least one of the plurality of electrical contacts of the base printed circuit extends on an exterior surface of the base printed circuit; and at least one of the secondary contacts of at least one of the secondary printed circuits extends on an exterior surface of the corresponding secondary printed circuit.

11. The printed circuit assembly according to claim 7, wherein at least one of the secondary printed circuits extends at an approximately non-parallel angle relative to the base printed circuit.

12. The printed circuit assembly according to claim 7, wherein at least one of the secondary printed circuits extends approximately perpendicular relative to the base printed circuit.

13. The printed circuit assembly according to claim 7, wherein the secondary printed circuits comprise two printed circuits that extend approximately parallel relative to each other.

14. The printed circuit assembly according to claim 7, wherein the secondary printed circuits comprise two printed circuits that at least one of comprise different thicknesses and extend different heights.

* * * * *